Figure 1:
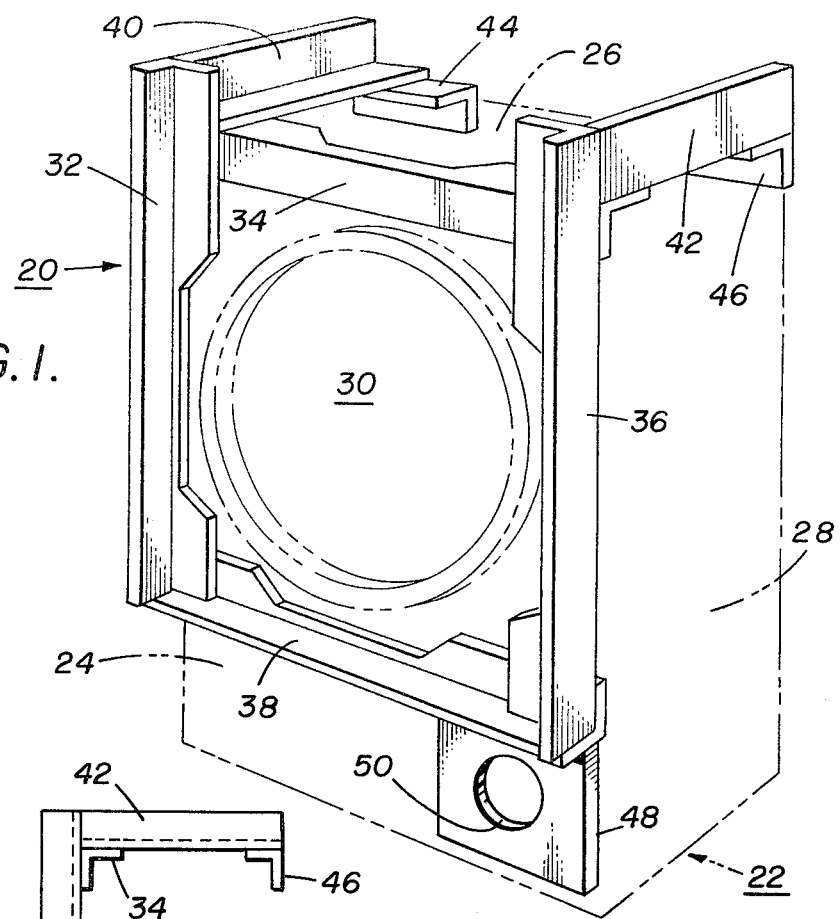

United States Patent [19]

Cooper

[11] 4,427,172

[45] Jan. 24, 1984

[54] FRAME FOR TAMPER PROOFING A METER HOUSING

[76] Inventor: Clinton V. Cooper, 311 Sands Pl., Pensacola, Fla. 32505

[21] Appl. No.: 312,637

[22] Filed: Oct. 19, 1981

[51] Int. Cl.³ .................... G01C 1/04; F16M 13/02
[52] U.S. Cl. .................................. 248/551; 220/210; 324/156; 361/369
[58] Field of Search .............. 73/431, 201; 324/110, 324/156; 220/210, 3.8, 401, 400; 70/158; 361/369, 370, 371, 364; 248/551, 552, 553

[56] References Cited

U.S. PATENT DOCUMENTS

| | | | |
|---|---|---|---|
| 1,739,142 | 12/1929 | Hill et al. | 361/370 X |
| 2,096,857 | 10/1937 | Pixley et al. | 361/364 |
| 3,683,102 | 8/1972 | Moran et al. | 324/110 X |
| 4,028,913 | 6/1977 | Falk | 248/553 X |
| 4,353,521 | 10/1982 | Webb | 248/55 X |

FOREIGN PATENT DOCUMENTS 1194946  6/1965  Fed. Rep. of Germany ...... 361/369

*Primary Examiner*—Gerald Goldberg
*Assistant Examiner*—Tom Noland
*Attorney, Agent, or Firm*—Kelly O. Corley

[57] ABSTRACT

A rigid frame attachment for resisting tampering with an electrical meter. Angle irons enframe the meter face, with frame portions extending rearwardly along a lateral wall of the meter housing to rear frame portions engaging the rear wall of the housing. The front of the frame is attached, as by a lock, to the meter front wall at a point spaced from the side walls of the housing.

4 Claims, 2 Drawing Figures

U.S. Patent      Jan. 24, 1984      4,427,172

FRAME FOR TAMPER PROOFING A METER HOUSING

The invention relates to the art of resisting tampering with electrical wattmeters. Large numbers of such meters are currently in use, wherein the meter housing is formed from a relatively light gauge of sheet metal. The present invention provides a rigid external attachment for such meters.

According to a major aspect of the invention, there is provided a tamper-resistant rigid frame attachment for mounting on an electrical meter housing, the housing comprising a front wall containing an opening for a meter face, a rear wall, and lateral walls connecting the front and rear walls and enclosing the meter, the lateral walls comprising top, bottom and side walls, the frame comprising front frame means enframing the opening; second frame means extending rearwardly along one of the lateral walls from the front frame means to rear frame means for engaging the rear wall; and means for securing the front frame means to the front wall at a point spaced from the side walls.

According to another aspect of the invention, one of the lateral walls is the top wall of the housing.

According to another aspect of the invention, the second and third frame means comprise separate laterally spaced members rigidly attached to the first frame means, the lateral spacing of the separate members being sufficient to span an electrical cable entering the top wall.

According to another aspect of the invention, at least one of the means comprises a portion formed of angle iron.

Figure 2:
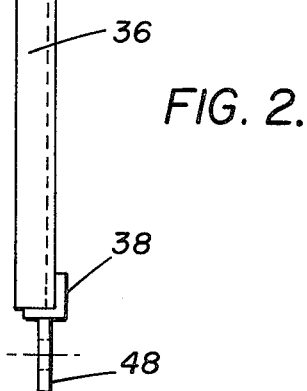

Other aspects will in part appear hereinafter and will in part be obvious from the following detailed description taken in connection with the accompanying drawing, wherein:

FIG. 1 is a perspective view of the preferred embodiment of the invention mounted on a meter housing, and FIG. 2 is a side elevation view of the FIG. 1 embodiment.

In FIG. 1, attachment 20 is shown mounted on meter housing 22 (shown in dotted lines). Housing 22 is a rectangular prism defined by six rectangular walls: front wall 24, upper wall 26, first side wall 28, a rear wall parallel and opposed to front wall 24, a lower wall parallel and opposed to upper wall 26, and second side wall parallel and opposed to first side wall 28. The six walls enclose a conventional meter, with front wall 24 containing opening 30 through which the meter face can be viewed. As used herein, the term "lateral wall" means any of the six housing walls other than front wall 24 and the opposed rear wall.

Attachment 20, as illustrated, is preferably primarily constructed of lengths of angle iron or other rigid material welded or otherwise rigidly attached together to form a rigid intergral frame mountable on housing 22. Thus, lengths 32, 34, 36 and 38 of angle iron are welded together to form a rectangle enframing opening 30, the lengths being relieved or cut away as necessary to provide clearance for opening 30 during installation or removal. Lengths 32, 34, 36 and 38 thus constitute front frame means enframing opening 30.

Second frame means are provided by lengths 40 and 42 of angle iron extending rearwardly along a selected one of the lateral walls from the front frame means to rear frame means for engaging the rear wall of the housing. As illustrated, the rear frame can likewise be formed from lengths of angle iron welded or otherwise rigidly attached to lengths 40 and 42. The selected one of the lateral walls is preferably top wall 26, as illustrated, in which case lengths 44 and 46 are preferably not integral. That is, the second and third or rear frame means comprise separate laterally spaced members rigidly attached to the first frame means, the lateral spacing of the separate members being sufficient to span (not interfere with) an electrical cable entering top wall 26. In the illustrated embodiment, lengths 40 and 44 constitute one of the separate members, while lengths 42 and 46 constitute the second of the separate members. If the selected one of the lateral walls is not penetrated by an electrical cable or other obstruction, it is not necessary to provide for separate laterally spaced members.

Finally, means are provided for securing the front frame means to front wall 24, as by heavy metal strap 48 welded to length 38. An aperture 50, aligned with a similar aperture in front wall 24, provides for locking attachment 20 to housing 22, as by use of the bolt-type lock disclosed in U.S. Pat. Nos. 3,835,674 and in 3,714,802. It is particularly noted that aperture 50 does not lie in the plane of either side wall, but is centered at a point spaced from the side walls. Thus attachment 20 cannot be pivoted about the lock in aperture 50 without crushing a corner of housing 22.

To remove attachment 20 for authorized access to the meter, the lock is removed. Then attachment 20 is lifted vertically sufficiently for the depending flanges on lengths 44 and 46 (the rear frame means) to clear top wall 26, after which attachment 20 can be moved generally horizontally away from housing 22 for full removal.

What is claimed is:

1. A tamper-resistant rigid frame attachment for mounting on an electrical meter housing, said housing comprising a front wall containing an opening for a meter face, a rear wall, and lateral walls connecting said front and rear walls and enclosing said meter, said lateral walls comprising top, bottom, and side walls, said frame comprising:
   a. front frame means enframing said opening;
   b. second frame means extending rearwardly along one of said lateral walls from said front frame means to rear means for engaging said rear wall; and
   c. means for securing said front frame means to said front wall at a point spaced from said side walls.

2. The attachment defined in claim 1, wherein said one of said lateral walls is said top wall of said housing.

3. The attachment defined in claim 2, wherein said second and rear frame means comprise separate laterally spaced members rigidly attached to said first frame means, the lateral spacing of said separate members being sufficient to span an electrical cable entering said top wall.

4. The attachment defined in any of claims 1–3, wherein at least one of said means comprises a portion formed of angle iron.

* * * * *